US005804774A

United States Patent [19]

Ford et al.

[11] Patent Number: 5,804,774

[45] Date of Patent: Sep. 8, 1998

[54] PORTED REFLEX HORN

[75] Inventors: Robert B. Ford, Cromwell; Thomas J. Bekasi, Meriden, both of Conn.

[73] Assignee: Whelen Engineering Company, Inc., Chester, Conn.

[21] Appl. No.: 752,874

[22] Filed: Nov. 20, 1996

[51] Int. Cl.$^{6}$ ........ H05K 5/00

[52] U.S. Cl. ........ 181/152; 181/155; 181/188

[58] Field of Search ........ 181/152, 153, 181/155, 156, 182, 187, 188, 191, 193, 195; 381/156, 158, 160

[56] References Cited

U.S. PATENT DOCUMENTS

| | | | |
|---|---|---|---|
| 3,432,002 | 3/1969 | Cohen | 181/152 |
| 4,893,343 | 1/1990 | Bader . | |
| 5,359,158 | 10/1994 | Queen | 181/152 X |

*Primary Examiner*—Khanh Dang
*Attorney, Agent, or Firm*—Alix, Yale & Ristas, LLP

[57] ABSTRACT

An integrally formed ported reflex horn comprises an outer housing having a plurality of side walls disposed about a central axis, an open discharge end and a second closed end, oppositely disposed to the open end. The horn also includes a compression driver reception member, for rigidly maintaining a conventional compression driver within the hollow interior of the horn housing, and sound wave guide structure which defines a plurality of ports and a divider for splitting sound waves exiting the throat of the compression driver into a plurality of constituent sound waves of substantially equal sound pressure levels. The constituent sound waves are redirected toward the housing open end as they travel through respective ports and are recombined into a single wave front after exiting the ports upstream of the housing open end.

14 Claims, 3 Drawing Sheets

PORTED REFLEX HORN

BACKGROUND OF THE INVENTION

1. Field of the Invention

The present invention generally relates to the efficient production of high volume audible siren signals and the like. More particularly, this invention is directed to a ported reflex horn designed for use with a conventional compression driver to generate increased sound pressure levels while being more compact than previous horns. Accordingly, the general objects of the present invention are to provide novel and improved methods and apparatus of such character.

2. Description of the Related Art

It is well-known in the art of emergency loudspeaker systems to employ the combination of a high power compression driver assembly and a horn to convert amplified electrical signals in the audio frequency range which are delivered to the driver into audible siren tones. One commonly used horn configuration is that of a re-entrant horn. Re-entrant horns utilize at least two horn sections which "fold back" on one another, rather than a straight bell-shaped horn such as those commonly used on brass and woodwind musical instruments. Since sound waves passing through a re-entrant horn travel in multiple opposite directions, this horn arrangement presents the sound waves passing therethrough with a passage duct which is the same length as a "straight" horn of a much larger size. Because re-entrant horns offer a compact alternative to straight horns, they have found widespread acceptance for use where space is limited. For example, re-entrant type horns have often been employed in emergency vehicle sound systems which produce siren tones. In the environment of an emergency vehicle, the re-entrant horn is usually mounted within the engine compartment, i.e., behind the radiator grill, or on the bumper of the vehicle.

One deficiency of both conventional re-entrant and straight bell-shaped horn designs is that the compression driver assembly used therewith is usually mounted from the rear of, and axially aligned with, the bell of the horn. Thus, the throat of the driver faces the direction in which sound waves emanating from the horn will be radiated. A sound generator having a forward facing driver is necessarily somewhat elongated and thus inefficient in its utilization of space.

As another deficiency of many prior art siren signal generators, and particularly those with a forward facing driver, the driver is exposed to the outside environment and thus subject to failure due to the entry of debris or water. While driver protection could be improved by utilizing additional housings, such a solution increases materials, overall size, cost and labor.

The above-discussed and other deficiencies of prior art horns have led to attempts to provide reflex horn designs wherein a conventional compression driver is mounted within the horn so as to face in a direction which is generally opposite to the direction in which sound waves exiting the horn will travel. Insofar as such designs allow the driver to be mounted within the housing which defines the horn, they successfully reduce the overall size of the horn/driver assembly. Further, these designs also provide increased protection for the compression driver. However, such designs have heretofore generally suffered from poor overall performance (e.g., lower sound pressure levels per watt delivered to the driver). This poor performance is due, in part, to the fact that prior art reflex horns have typically been formed from a plurality of individual components which are assembled into a single unit. In addition to reducing efficiency of the horn, as a result of interference caused by air leakage, multiple component designs obviously entail an increase in manufacturing complexity and cost.

There has, accordingly, been a long unfulfilled desire for an improved reflex horn, suitable for employment in emergency vehicle loudspeaker systems, which is capable of producing higher sound pressure levels while occupying the same or even less space than previously existing horn designs. Such an improved horn should be inexpensive to manufacture and easy to install on a vehicle.

SUMMARY OF THE INVENTION

The present invention overcomes the above-briefly discussed and other deficiencies and disadvantages of the prior art and, inso doing, provides an integrally formed, i.e., one piece, ported reflex horn for use with a compression driver of the type having a throat from which sound waves emanate. A horn in accordance with the invention comprises an outer housing having a plurality of side walls disposed about a central axis, the side walls defining an open discharge end, and a second end, oppositely disposed to the discharge end, which connects the side walls of the housing together to form a closed end thereof. The horn also includes a compression driver reception member for positioning a conventional compression driver within the hollow interior of the horn outer housing such that the axis of the throat of the driver is substantially coaxial with the housing central axis and the throat faces the closed end of the housing. Communication between a compressor driver supported on the reception member and an expansion chamber within the horn immediately downstream of the driver is via a coaxial aperture in the reception member. Finally, the horn of the invention includes integral guide structure for directing sound waves exiting the throat of the compression driver to a main chamber which is in communication with the discharge end of the horn. The guide structure, in the preferred embodiment, cooperates with the outer housing and driver reception member to define four ports which extend from the vicinity of the throat of the driver to the main chamber. The entrance ends of these ports, in part, are defined by a divider member which protrudes from the closed end of the housing into the expansion chamber and towards the driver throat. The divider member splits sound waves exiting the throat of the compression driver into a plurality of constituent sound waves of substantially equal sound pressure levels. The ports have the same cross-sectional area, measured transverse to the central axis of the housing, and expand in area in the downstream direction of sound wave travel therethrough. The constituent sound waves are recombined at the downstream ends of the ports, i.e., in the main chamber, to form a single wave front which exits the open end of the housing. The main chamber is defined by the horn housing and by the outer shape of the compression driver.

DESCRIPTION OF THE DRAWINGS

The present invention may be better understood, and its numerous objects and advantages will become apparent to those skilled in the art, by reference to the accompanying drawings wherein like reference numerals refer to like elements in the several Figures, and wherein.

DESCRIPTION OF THE DISCLOSED EMBODIMENT

Figure 6:
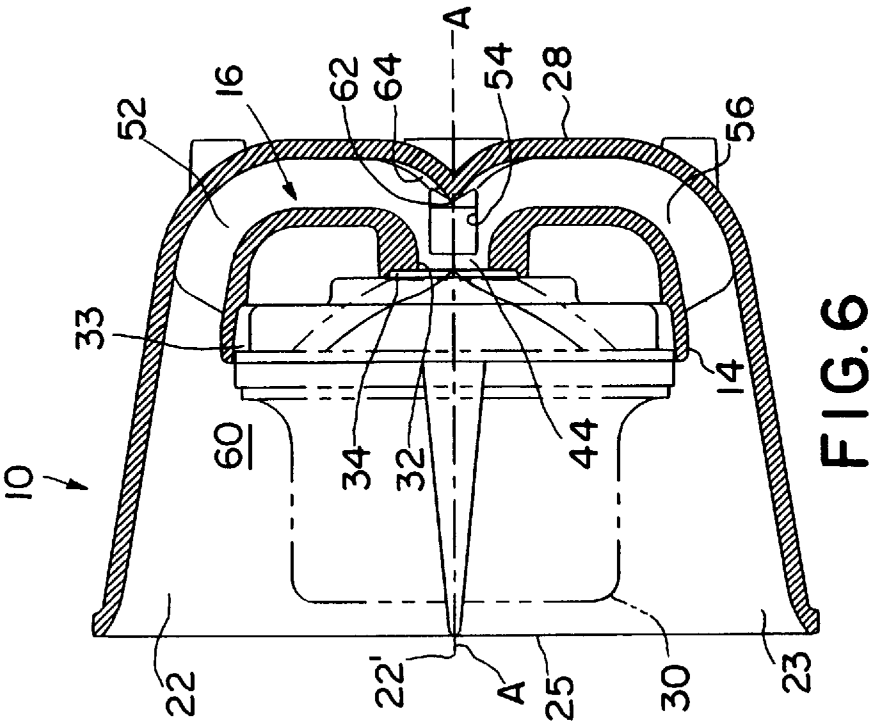
FIG. 6 is a cross-sectional view of the horn of FIG. 5, taken along line 6—6 of FIG. 5, with the driver shown in phantom.
Figure 5:
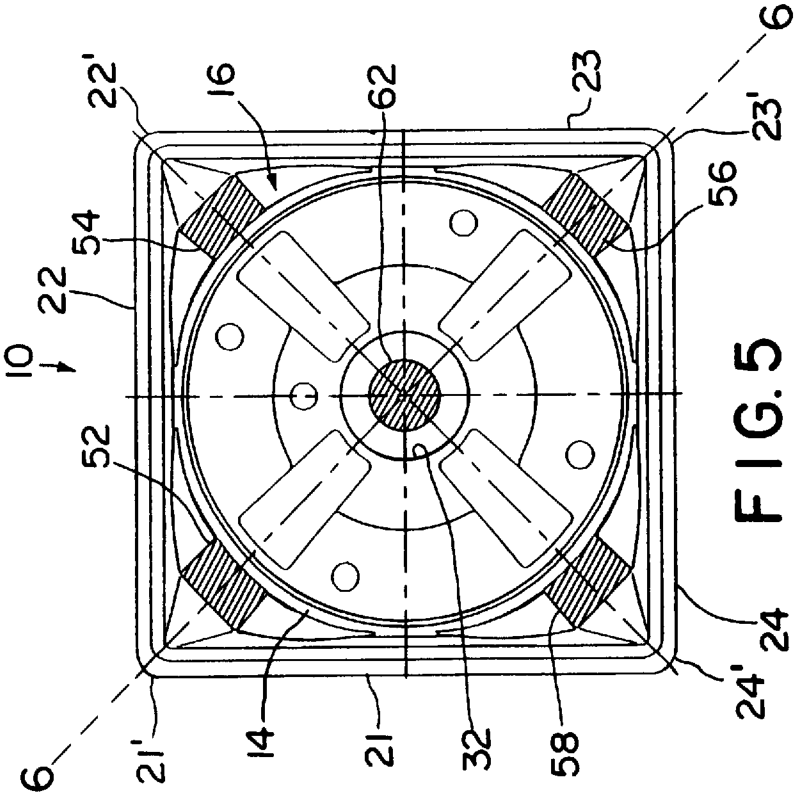
FIG. 5 is a front elevation view of the horn of FIG. 1, the horn being illustrated without a compression driver mounted therein.

With joint reference to all of the Figures, a ported reflex horn in accordance with the disclosed embodiment of the present invention is indicated generally at 10. Horn 10 comprises an outer housing 12 and, located therein and integral therewith, a driver reception member 14. A sound wave guide structure, generally indicated at 16 in FIGS. 5 and 6, is disposed between, and is integral with, outer housing 12 and driver reception member 14. Housing 12 is preferably generally cubicly shaped and includes first, second, third and fourth sides 21, 22, 23 and 24, respectively. As shown, sides 21–24 are disposed about a central axis A and cooperate to define an open discharge end 25. Housing 12 also includes a closed second end 28, oppositely disposed with respect to discharge end 25, and first, second, third, and fourth corners 21', 22', 23' and 24' at the intersections of adjacent sides.

Figure 1:
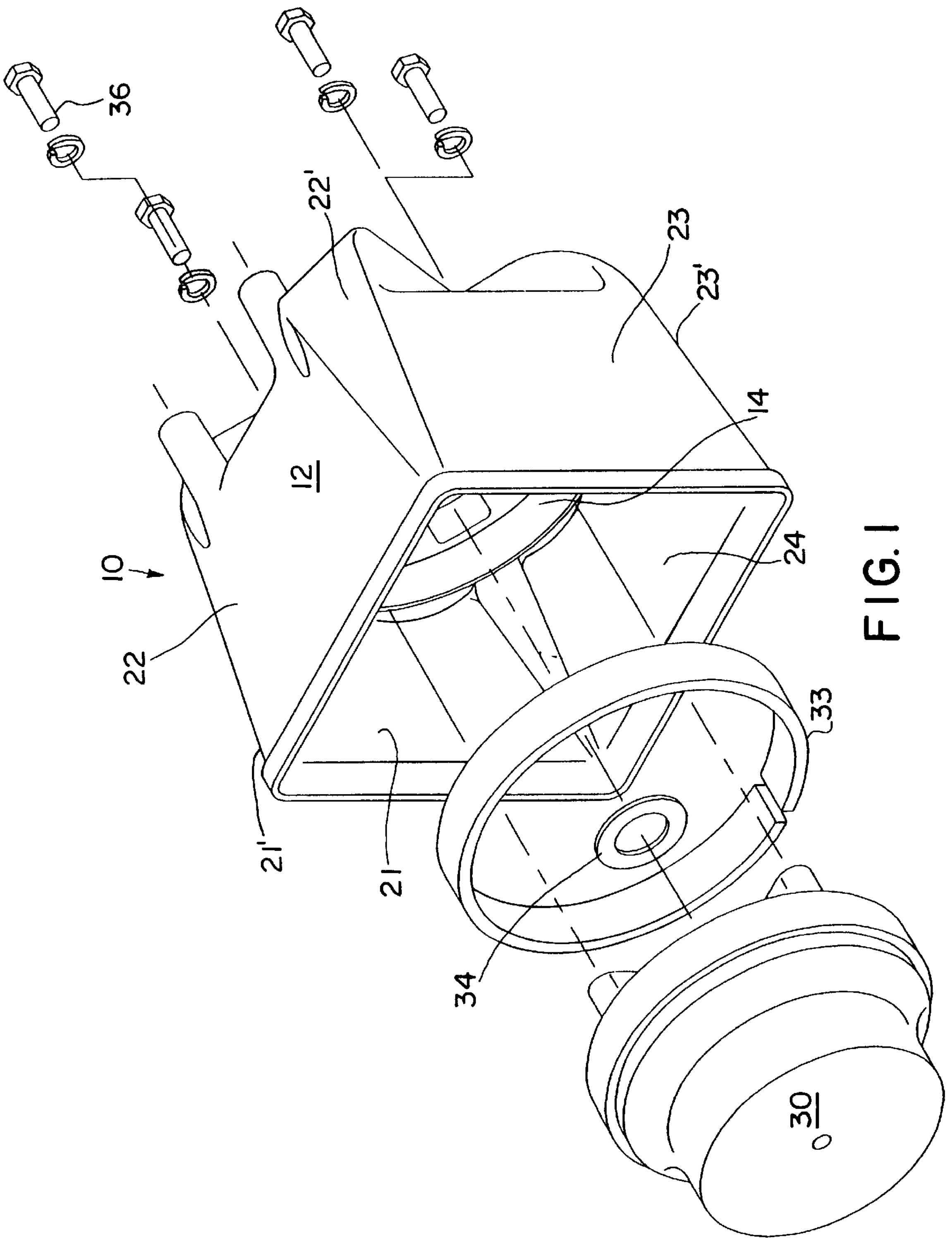
FIG. 1 is an exploded perspective view of a ported reflex horn in accordance with the present invention, the horn being illustrated in combination with a conventional compression driver.

Driver reception member 14 is coaxial with and symmetrical about axis A and is located adjacent second end 28 of housing 12. Reception member 14 defines a forwardly facing recess which includes a plurality of coaxial seating surfaces or shoulders. This recess is substantially complementary in shape to the forward portion of a conventional compression driver such as the compression driver 30 shown in FIG. 1. It will be readily appreciated that, upon reception of driver 30 within reception member 14 as best seen from FIG. 6, the throat of the driver will be coaxially aligned with axis A and will be juxtapositioned to a coaxial central aperture 32 provided in reception member 14. It will also be readily appreciated that reception of driver 30 within reception member 14 in this manner allows the sound waves generated by the driver, i.e., the pulsating column of air emanating from the throat of compression driver 30, to enter passages which, in part, are defined by the sound wave guide structure 16. Additionally, this arrangement ensures that driver 30 is disposed well within sides 21–24 of housing 12, i.e., the driver is recessed with respect to discharge end 25. Since sides 21–24 extend forwardly of driver 30, driver 30 is protected from physical abuse by sides 21–24.

In order to ensure maximum efficiency, by eliminating air leakage and minimizing driver vibrations, a foam seal 33 and a gasket 34 are preferably disposed between driver 30 and adjacent surfaces of reception member 14. As disclosed, seal 33 is in the form of a split ring which extends circumferentially about driver 30 while gasket 34 is compressed between the driver and a forward facing seat which extends about aperture 32. Seal 33 and gasket 34 can be made from any of the conventional, and widely used, vibration dampening materials such as neoprene. Compression driver 30 is rigidly affixed to horn 10, i.e., is tightly seated in reception member 14, by any conventional means such as bolts 36 which extend through fastening apertures 38 in end 28 of housing 12 and into complementary receptors (not shown) such as threaded bores in the casing of driver 30. Bolts 36 are preferably provided with lock washers to ensure that loosening thereof due to, for example, vibrations will not occur.

The overall dimensions of horn 10 can be selected for any particular application, but the minimum dimensions thereof are constrained by the need for horn 10 to accommodate a given compression driver selected for a particular application.

Horn 10 is preferably integrally formed of aluminum using a conventional sand casting process. Horn 10 could, however, be formed of other conventional and widely used materials and also through other conventional and widely used processes.

Figure 4:
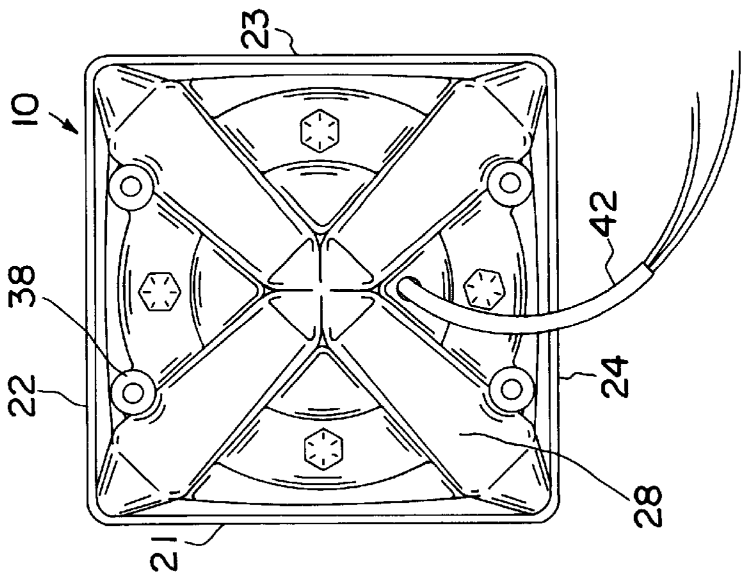
FIG. 4 is a rear elevation view of the horn shown in FIGS. 1–3.
Figure 3:
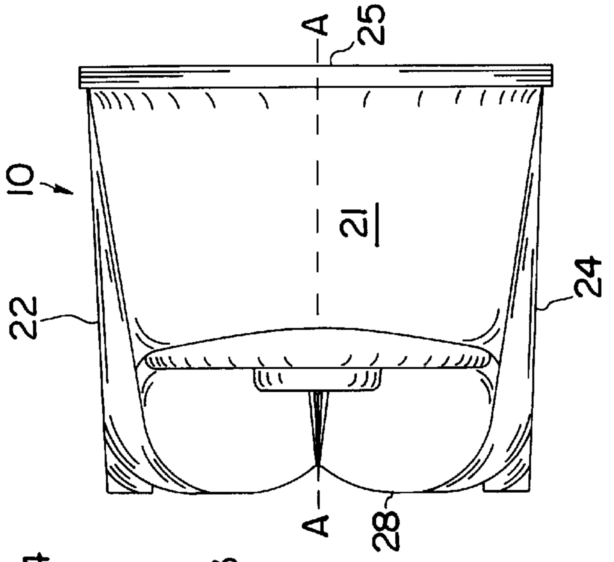
FIG. 3 is side elevation view of the horn of FIGS. 1 and 2.
Figure 2:
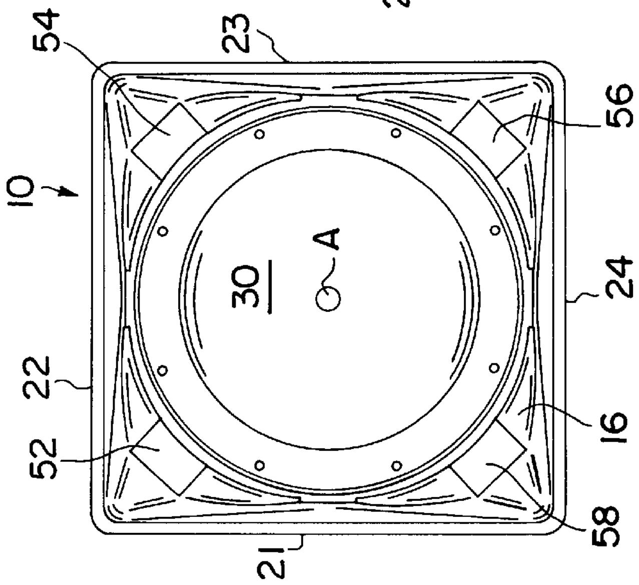
FIG. 2 is a front view of the horn of FIG. 1 with the compression driver mounted therein.

In order for compression driver 30 to generate sound waves, the driver must receive amplified electrical signals in the audible frequency range. As best illustrated in FIG. 4, the voice coil of driver 30 is preferably connected to an audio signal amplifier (not shown) via conventional wiring 42. In order to accommodate wiring 42, a wiring aperture, which extends through second end 28 of outer housing 12, is provided.

Referring to FIGS. 5 and 6, sound wave guide structure 16 occupies the spacing between outer housing 12 and reception member 14. Guide structure 16, in part, defines a single, non-linear expansion chamber 44 which is in direct communication with the throat of driver 30 via aperture 32. The phase plug of driver 30 extends rearwardly, with respect to the horn discharge end 25, to the point where the annularly shaped air column, which results from the presence of the phase plug, reforms into a “solid”, i.e., continuous or uninterrupted cross-section, column in chamber 44. Guide structure 16 also cooperates with outer housing 12 and reception member 14 to define first, second, third and fourth passages or ports 52–58. These ports turn smoothly from chamber 44 so as to extend generally radially with respect to axis A. Ports 52–58 then again turn smoothly, i.e., there are no sharp corners or upstanding walls in the flow paths, at respective corners 21'–24' of housing 12 and follow the outer housing corners to their discharge ends. The discharge ends of ports 52–58 are in communication with a main chamber 60 and, to enhance the ability of those skilled in the art to understand the invention, have been shaded in FIG. 5. Each of ports 52–58 has a cross-section which expands exponentially in the downstream direction between chamber 44 and its discharge end. This configuration allows controlled volumetric expansion of the constituent sound waves travelling through ports 52–58 with the expansion starting immediately downstream of the phase plug of driver 30. The constituent sound waves exiting ports 52–58 recombine in main chamber 60. As best seen from FIG. 6, chamber 60, at its upstream end, is of generally annular shape and, in part, is defined by the exterior of the casing of driver 30. The non-linear expansion of the sound wave front, i.e., the recombined sound waves exiting the four ports, is continued until the mouth of the horn defined by the discharge end 25 of housing 12 is reached. The sound waves pass out of horn 10 in the general direction of axis A as a single wavefront.

The entrance ends of ports 52–58 are, in part, defined by a splitter or divider member 62. Divider member 62 is integral with second end 28 of housing 12 and is coaxially disposed with respect to axis A. The vertex of divider member 62 extends into chamber 44 in the direction of the throat of driver 30. In the disclosed embodiment, divider member 62 has a generally tetrahedronal shape which includes first, second, third and fourth surfaces such as surface 64. These surfaces blend into and thus form wall portions of the first curved regions of ports 52–58. Divider member 62 is sized, shaped and positioned within chamber 44 such that the "solid" air column which forms downstream of the phase plug of driver 30 is immediately divided into four constituent sound waves which travel along respective of ports 52–58.

The cooperation of the various components of the preferred embodiment of horn 10 will now be summarized. When driver 30 is received within reception member 14, sound waves originating at the throat of driver 30 enter chamber 44 downstream of the phase plug of the driver. The sound waves initially travel in a direction which is generally away from horn discharge end 25 until encountering divider member 62 which, due to the above-described geometry and orientation, divides the sound waves into four constituent sound waves of substantially equal sound pressure levels. These constituent sound waves travel along ports 52–58 where they experience an exponential increase in volume as they are guided first radially outward and then around corners 21'–24', i.e., the sound waves are redirected or folded into a direction which is generally parallel to that of axis A. After the constituent sound waves exit the four ports, i.e., downstream of the port discharge ends, they recombine into a single sound wave front. This wave front is projected along axis A through open end 25 of housing 12 and into the ambient environment.

In a typical application, driver 30 receives an amplified audio frequency signal, e.g., an undulating siren signal, which comprises a plurality of frequencies falling within a predetermined frequency range about a mid-range frequency. Thus, the sound waves emanating from driver 30 comprise a plurality of frequencies falling within a predetermined frequency range about a mid-range frequency. In order to maximize the efficiency of horn 10 by minimizing losses due to destructive interference, ports 52–58 are preferably formed so that the distance between the throat of compression driver 30 and the discharge ends of ports 52–58 is substantially equal to the wavelength of the mid-range frequency of the audio signal to be generated. Alternatively, this distance could be selected to be substantially equal to the wavelength of a preselected harmonic of the mid-range frequency. Such an arrangement would change the tonal quality of the generated sound by accentuating one or more particular harmonics (e.g., a first octave) of the mid-range frequency.

While a preferred embodiment of the present invention has been illustrated and described in detail, many modifications and changes thereto are within the skill of ordinary artisans. Therefore, the appended claims are intended to cover any and all modifications which fall within the spirit and the scope of the invention and, hence, are not limited to the embodiment expressly described above.

What is claimed is:

1. A ported reflex horn for use with a compression driver of the type having a throat, said horn comprising:

a unitary outer housing, said housing including plural generally planar side walls which cooperate to define a central axis, adjacent pairs of said side walls defining corners of said housing, said housing having an open discharge end and an oppositely disposed closed second end;

driver reception means for supporting a compression driver within said outer housing with the throat of the driver oriented generally coaxial with said central axis and facing said second end of said outer housing, said driver reception means being integral with said housing and defining an aperture coaxial with said central axis and in registration with the driver throat;

guide means for directing sound waves which exit the throat of the compression driver and pass through said aperture to said discharge end of said housing, said guide means being integral with said reception means and said outer housing and cooperating therewith to define a plurality of smooth walled discrete ports which extend downstream in the direction of sound wave travel from said aperture, said ports having a generally rectangular cross-section and following non-linear paths of substantially identical length and cross-section, the cross-section of said ports increasing in the downstream direction to discharge ends thereof, said port discharge ends being located within said outer housing; and divider means extending from said housing second end toward said aperture, said divider means being coaxial with and symmetric about said central axis, said divider means cooperating with said guide means and said reception means to define the entrance ends of said ports, said port entrance ends being juxtapositioned to said aperture and in communication therewith via a common chamber whereby sound waves emanating from a driver received in said reception means and entering said common chamber are immediately divided into plural constituent sound waves which are recombined downstream of the discharge ends of said ports and upstream of the discharge end of said housing.

2. The ported reflex horn of claim 1, wherein said housing has four side walls and each pair of adjacent walls of said housing cooperate to define housing corners, and wherein the discharge ends of each of said ports is disposed within a different corner of said housing.

3. The ported reflex horn of claim 2, wherein said divider means splits sound waves incident thereon into four sound waves of substantially equal sound pressure and redirects each of said four sound waves into a respective one of said ports whereby four generally radially diverging sound waves are created.

4. The ported reflex horn of claim 3, wherein said ports are generally symmetric and of substantially equal length.

5. The ported reflex horn of claim 4, wherein the distance between said aperture and said discharge ends of said ports is substantially equal to the wavelength of the mid-range frequency of a variable frequency audible signal to be radiated from the horn.

6. The ported reflex horn of claim 4, wherein said divider means comprises a generally tetrahedron-shaped member which is symmetrically disposed about said central axis such that the vertex of said divider means faces said aperture.

7. A ported reflex horn for use with a sound emitter of the type having a throat, said horn comprising:

a horn outer housing having four generally planar side walls symmetrically disposed about a central axis such that a corner is defined at the intersection of each pair of adjacent walls, said housing defining an open discharge end of the horn and an opposing second closed end;

sound emitter reception means symmetrically disposed about said central axis within said housing, said reception means rigidly supporting a sound emitter within said housing such that a throat of a supported sound emitter is in fluid communication with and faces said housing second end, a supported sound emitter being substantially coaxially disposed with respect to said central axis; and sound wave guide means symmetrically disposed about said central axis at said second end of said housing, said guide means in part comprising four continuous waveguides, each of said waveguides extending generally radially with respect to said central axis toward one of said corners and thereafter curving into a direction which is generally parallel to said central axis, each of said waveguides terminating at an open end thereof which is disposed within one of said corners and upstream of said horn discharge end, said guide means further including divider means coaxial with and symmetrically disposed about said central axis for dividing sound waves generated by a sound emitter supported on said reception means into a plurality of constituent sound waves of substantially equal sound pressure levels, each of said constituent sound waves being directed by said dividing means into one of said waveguides whereupon said constituent sound wave travels through said waveguides and exit through said open ends thereof, said constituent sound waves being recombined within said outer housing and downstream of said waveguide open ends.

8. The ported reflex horn of claim 7, wherein said waveguides are of substantially equal length.

9. The ported reflex horn of claim 8, wherein the sound waves generated by a supported sound emitter comprise a plurality of frequencies which fall within a predetermined frequency range about a mid-range frequency and wherein the length of said waveguides is substantially equal to the wavelength of said mid-range frequency.

10. The ported reflex horn of claim 8, wherein each of said waveguides has a cross-section which smoothly increases from said dividing means to said open ends.

11. The ported reflex horn of claim 10, wherein said dividing means comprises a polyhedron and the vertex of the polyhedron faces the throat of a supported sound emitter.

12. The ported reflex horn of claim 10, wherein said outer housing, reception means and guide means are integrally formed.

13. The ported reflex horn of claim 12 wherein said reception means has an aperture coaxial with said central axis, sound waves produced by a supported emitter passing through said aperture, and wherein said guide means further defines a common expansion chamber between said aperture and entrance ends of said waveguides.

14. The ported reflex horn of claim 13, wherein said dividing means comprises a polyhedron and the vertex of the polyhedron faces the throat of a supported sound emitter.

* * * * *